United States Patent [19]

Glenn et al.

[11] Patent Number: 5,482,736
[45] Date of Patent: Jan. 9, 1996

[54] METHOD FOR APPLYING FLUX TO BALL GRID ARRAY PACKAGE

[75] Inventors: Thomas P. Glenn, Phoenix, Ariz.; Roy D. Hollaway, Metro Manila, Philippines

[73] Assignee: Amkor Electronics, Inc., Chandler, Ariz.

[21] Appl. No.: 286,153

[22] Filed: Aug. 4, 1994

[51] Int. Cl.$^6$ ............................... B05D 1/28; B23K 3/00
[52] U.S. Cl. ........................ 427/96; 427/259; 427/310; 228/207; 228/35
[58] Field of Search .................................... 228/207, 223, 228/35; 118/264, 109; 427/96, 429, 259, 260, 310

[56] References Cited

U.S. PATENT DOCUMENTS

| | | | |
|---|---|---|---|
| 2,823,633 | 2/1958 | Meier et al. | 228/35 |
| 4,931,313 | 6/1990 | Arakawa et al. | 427/429 X |
| 5,024,372 | 6/1991 | Altman et al. | 228/248 |
| 5,074,455 | 12/1991 | Peana et al. | 228/35 |

FOREIGN PATENT DOCUMENTS

| | | | |
|---|---|---|---|
| 63-317259 | 12/1988 | Japan | 228/35 |
| 3-133571 | 6/1991 | Japan | 228/35 |

OTHER PUBLICATIONS

IBM Technical Disclosure Bulleting, "Automatic Fux Applicator", vol. 34, No. 2, Jul. 1991, pp. 356–357.

*Primary Examiner*—P. Austin Bradley
*Assistant Examiner*—Jeanne M. Elpel
*Attorney, Agent, or Firm*—Skjerven, Morrill, MacPherson, Franklin, & Friel

[57] ABSTRACT

A method and apparatus for applying flux to a series of metallization contacts or plated contact pad a substrate exposed by an apertured solder mask, employs a compressible transfer pad. A central flux pick-up area is formed on the transfer pad bottom surface. The bottom surface may be spherical and may include a cylindrical post onto which a predetermined amount of flux is transferred, such as by dipping the pick-up area into a reservoir of semi-liquid paste flux. The transfer pad is then positioned over and compressed on the solder mask such that the picked up flux on the flux pick-up area of the transfer pad is pressure forced by compression of the transfer pad through apertures in the solder mask directly and successively into all the series of depressions formed on the substrate until all the depressions are substantially filled with flux. After breaking away and removal of the transfer pad, a solder ball or bonder applied solder is deposited in each flux-containing depression to form a metallurgical bond between the ball and a plated contact pad or package metallization such as a lead frame.

13 Claims, 3 Drawing Sheets

METHOD FOR APPLYING FLUX TO BALL GRID ARRAY PACKAGE

FIELD OF THE INVENTION

This invention is directed to a method of applying flux to an insulative substrate which is part of a semiconductor die package. More particularly the invention is directed to a method and apparatus for distributing flux onto an area of a substrate on which a series of solder balls are to be formed and connected to metallization in the substrate.

BACKGROUND OF THE INVENTION

The use of solder bumps or balls on a substrate for solder attachment to another abutting substrate by reflowing the bump or ball is known in the art. The solder bumps or balls are particularly useful with ball grid arrays (BGA's) where the balls are formed at finely spaced positions on an exterior surface of a BGA package and where the balls connect to metallization in the package. The metallization in turn is connected by vias or plated through holes and bonding wires to the contact pads of an integrated circuit chip mounted within the BGA package. The currently most used method for forming the balls is to use a silk screen to place spaced small amounts of flux into the lands of the package. "Lands" as used herein means the landing area onto which contacts are connected. This has become more and more difficult to do as the spacing between the lands becomes very small i.e., of the order of 100 microns. Silk screening can also cause flux to be laid down outside the desired small areas and the result can be that when the solder balls are placed on desired spots, a ball or balls, will float on the flux and be moved away from the desired spot as the flux melts. This can cause adjacent balls to touch and thus undesirably cause an electrical short. The function of the flux is to cause the deposited solder ball to wet the metallization and upon solidification provide a suitable metallurgical connection at the desired spot or spots. The metallization spots are normally gold plated or otherwise plated or may be bare or OFHC copper. A series of small wells or holes of the order of 0.025" (25 mils) in diameter and 0.003" (3 mils) deep, extend from the planar surface of the package downwardly to the plated spot. The goal of the silk screening is to place flux into the small holes so that each solder ball when heated will use the flux to wet and connect to a plated spot. However this goal is difficult if not impossible to obtain in production since silk-screened flux just does not repeatedly fill or even go into each and every one of the spaced holes. The flux has a tendency to just run over the holes and to pile up and when melted to run over the entire substrate surface.

U.S. Pat. No. 5,024,372 discusses other prior art such as the use of stencils and where solder paste (flux) is applied to the substrate though its stencil by using a squeegee and the use of discrete solder balls which are precisely placed on the substrate, both of which techniques having recited shortcomings. In the latter, a jig picks up by vacuum a full supply of fluidized balls, touches the held balls in a flux, places the flux-coated balls on the package and removes the jig. Flux can migrate onto the jig and the next time the jig is used to pick up balls, the jig can pick up an excess of balls in the migrated flux and then deposit the excess balls in unwanted and shorting positions on the substrate.

The '372 invention involves application of a solder resist layer on a substrate and selectively removing the resist to form wells at solder pads on the substrate. A solder paste is then applied to the substrate or directly to the substrate by a squeegee. In one aspect of the '372 invention the wells are larger in diameter than the solder pads. A solder bumped member is then connected with the bumps located in the wells. The solder paste is reflowed to wet and help bond the solder bumps and the metallized pads to effect a metallurgical connection of the higher melting temperature solder bumps to the metallized pads of the substrate.

In utilizing silk screens and stencils inherently there is an alignment problem in accurately positioning the screen or stencil correctly over the series of plated spots, controlling the amount of flux into each hole, avoiding excess flux application and avoiding the costly need for a special screen or stencil for each size of substrate, each size of hole, each hole array design and the number of holes. If 500 holes are present then the screen or stencil must have 500 apertures. Thus there has been need to accurately fill various series of holes in substrates with flux without having excess flux spill over to the edges of the substrate or a build-up of flux adjacent to the holes.

SUMMARY OF THE INVENTION

The present invention utilizes a compressible transfer pad for picking-up a predetermined amount of flux from a source of flux, the pad having a bottom surface having a central flux pick-up area. A predetermined amount of flux is picked up on the central flux pick-up area by dipping the pad preferably into a horizontal level of flux. The flux-containing transfer pad is placed over a solder mask on an insulating substrate, the mask containing a series of apertures aligned with a series of contacts on an insulative substrate, the apertures exposing contact metallizations in the substrate. The transfer pad and substrate are brought into contact with each other and moved against each other to compress the transfer pad against the mask and substrate to force flux from the transfer pad in seriatim into the series of depressions formed by the mask apertures and the substrate. Continued additional compression forces the flux from the transfer pad outwardly into all the depressions. The transfer pad, now substantially devoid of any flux, is then separated from the mask and substrate. Solder balls are then deposited on the flux-filled depressions. The spaced series of depressions are each in alignment with spaced portions of metallization in the substrate such that the deposited solder forms a metallized connection with the metallization portions.

In preferred embodiments the transfer pad bottom surface has a semi-spherical configuration so that the pole of the semi-spherical surface first contacts inner ones of the series of depressions and then forces the flux radially outwardly to fill outer holes in seriatim. In another embodiment an integral compressible center post extends from the bottom surface of the transfer pad, the post being dipped into a flux source to pick up a predetermined amount of flux. It is also contemplated that the predetermined amount of flux be dispensed or otherwise dropped onto the central pick-up area of the pad bottom surface.

DETAILED DESCRIPTION

Figure 1:
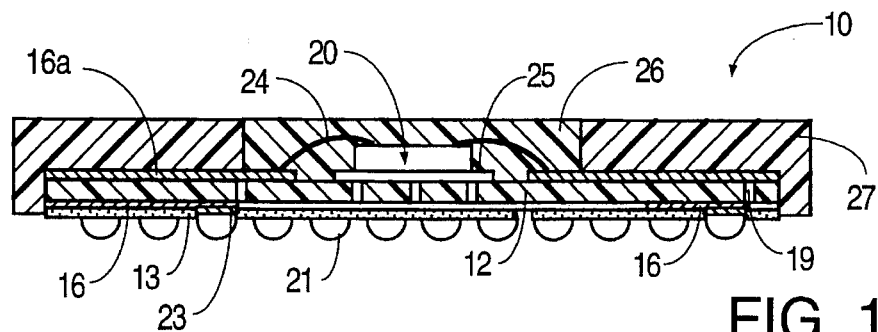
FIG. 1 is a cross-sectional view of a BGA assembly substrate including metallization and an IC chip therein.
Figure 2:
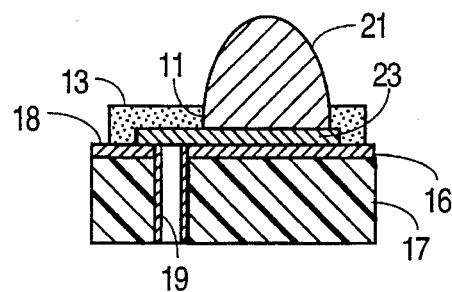
FIG. 2 is a schematic cross-sectional view of a solder ball as connected to a plated via in a printed circuit board.
Figure 3:
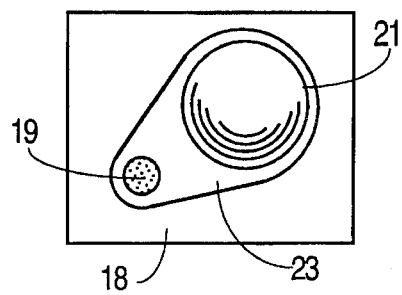
FIG. 3 is a top view thereof.
Figure 4:
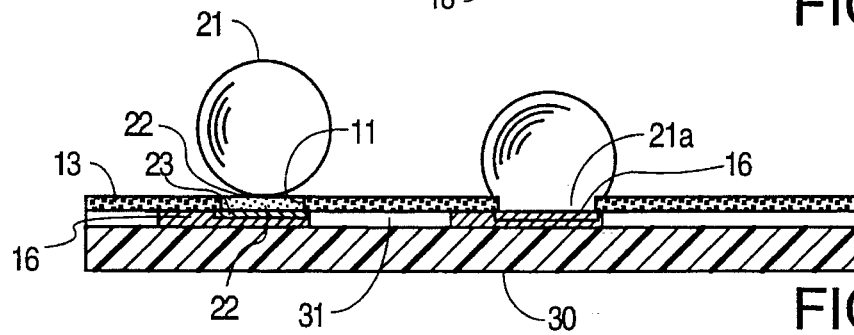
FIG. 4 is a partial cross-sectional view of a laminate showing flux-filled depressions and solder balls poised for reflow and reflowed therein.

The product made by the method of the present invention is seen in FIGS. 1–5. The method involves the accurate placing of flux into a series of depressions formed by apertures in an insulation solder mask 13 on a surface of a molded plastic package 10 where the apertures in the mask expose a plated (preferably gold or bare copper) pad 23 on one layer of metallization 16. Metallization in the form of a copper or copper alloy lead or lead frame 16 plated or etched on a substrate 12 forms a central die-mounting pad onto which a semi-conductor integrated circuit (IC) die 20 (FIG. 1) is mounted by a die-attach adhesive such as 965-1L available from Ablestick of California, or other adhesives as are known in the art. In this specification, the terms "lead" or "metallization" include package leads of all kinds including leads in stamped or etched frames and traces or lines or contacts formed by patterning deposited metal layer or other conductive layers. Inner portions of the lead or lead frame are gold-plated to receive bonding wires 24 connecting to contact pads (not shown) on the top of the IC die 20. Ground plane bond wires 25 may connect die ground pads (not shown) to a ground plane (not shown). A potting compound 26 such as HySol material may be used to encapsulate the chip 20 and a pre-molded PPS cover 27 utilized to complete the assembly. Each aperture 11 exposes a gold or exposed bare copper pad 23 (FIG. 2) plated on a spot on the metallization 16. The apertures in the insulative solder mask 13 (FIGS. 2–5 and 9) placed over the substrate forms depressions to hold the flux. A transfer pad 50 (FIGS. 6–13) pressure forces flux into each of the depressions 11. The holes or depressions formed by the solder mask in a typical 100–600 lead package have a diameter of from about 0.025" to about 0.035" and a depth of about 0.003" (3 mils) ±0.0005". A BGA is formed by bringing a series of balls 21, for example balls held in a jig into contact with flux at sufficient temperature (or by a bonder depositing a ball-like mass from a capillary in the bonder onto the flux in each depression 11), so that the flux melts and wets both the balls 21 and the gold or copper pads 23. After the ball is placed on the substrate with the flux, the ball is reflowed in an infra red convection furnace and a metallurgical bond results between each ball and its aligned gold or other conductive pad. This reflowing of the ball 21 is seen in FIG. 4 at 21a. As illustrated in FIGS. 2 and 3 the invention may be used to attach balls 21 to metallization pads 23 formed on a surface 18 of a printed circuit board 17 having a solder mask 13 thereover. The pads 23 may be connected by plated vias 19 to other metallization or contacts on the other side of the PCB. Flux can be applied to a silicon wafer such that when 0.008" or smaller eutectic balls are placed on top of board pads an inexpensive method of flip chip wafer preparation is accomplished.

Figure 5:
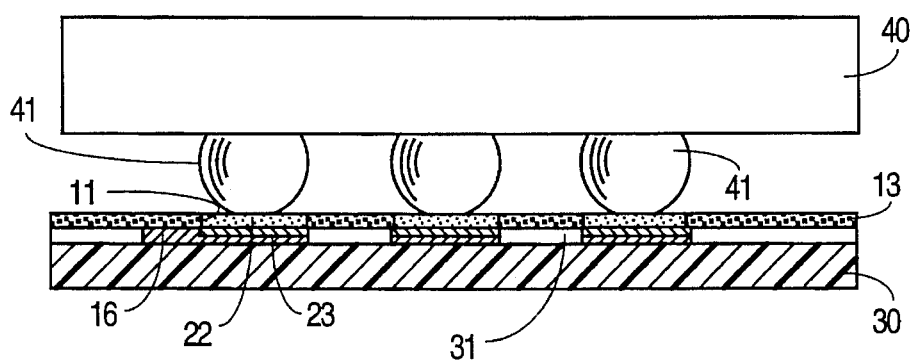
FIG. 5 is a partial cross-sectional view a further embodiment of the invention where a solder ball-containing silicon wafer is to be die-attached to a substrate such as a printed circuit board in a flip chip orientation.
Figure 6:
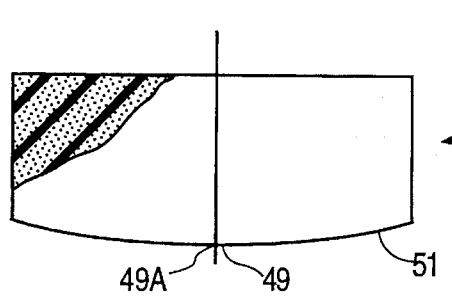
FIG. 6 is a side view, partially broken away, of one embodiment of the transfer pad of the invention.

In another embodiment as seen in FIG. 5, solder bumps or balls 41 are formed on a silicon wafer 40 and that wafer is die attached in a furnace normally at about 220° C. to an insulative substrate, such as a printed circuit board (PCB) 30 or ceramic substrate having a solder mask 13 thereover and having series of flux-containing depressions 11, each aligned with a solder ball 41 on the wafer. In this embodiment a solder mask 13 is applied over the PCB and a transfer pad, containing a predetermined amount of flux, is compressed on the mask and PCB to pressure force the flux into the depressions formed by the solder mask apertures above the PCB and its metallization. As in the earlier discussed embodiment the solder balls when heated with the flux in the depressions form a metallurgical bond electrical connection between the balls and metallizations 31 on the PCB.

The method of applying the flux 22 to the substrate is illustrated in FIGS. 6–11. A compressible transfer pad 50 including bottom surface 51 having a central flux pick-up area 49 is used to pressure force flux into the substrate holes. The pad 50 maybe circular or square or rectangle. The pad is the shape of the substrate. The pick-up area 49 may be the central part or pole of a semi-spherical bottom surface of the transfer pad 50. The transfer pad is preferably made of compressible silicone rubber. Silicone rubber or other compressible materials having a durometer reading on the Shore scale of from about 20 to about 90 may be employed. Pad durometer depends on the package size. In a 272 lead package, a relatively soft (lower durometer reading) transfer pad is employed while in a 500 lead package (43 mm×43 mm) a harder (heavier and higher durometer reading) transfer pad is utilized. Transfer pad material is available from the Manila Branch company of Dow Corning under the trademark and Part Designation of Casting Grade silicone. Typically, the radius of curvature of surface 51 is from about 30 cm to about 36 cm and is dependent on the substrate overall size.

Figure 7:
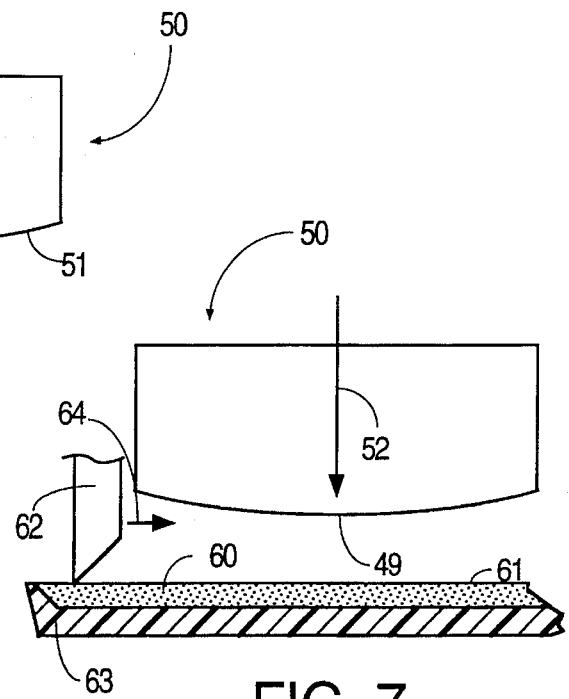
FIG. 7 is an illustration of the transfer pad prior to pick-up of flux from a source of flux.
Figure 8:
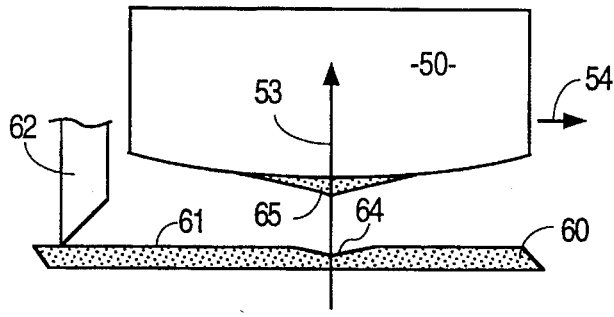
FIG. 8 illustrates the pick-up and removal of a predetermined amount of flux from the flux source.
Figure 9:
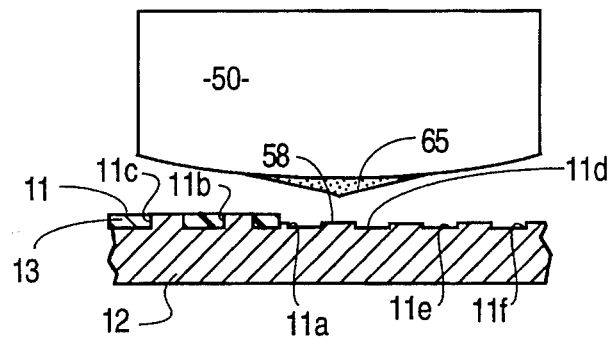
FIG. 9 illustrates the alignment of the flux-containing transfer pad with a substrate in cross-section having a series of depressions formed by a partially-shown solder mask.
Figure 10:
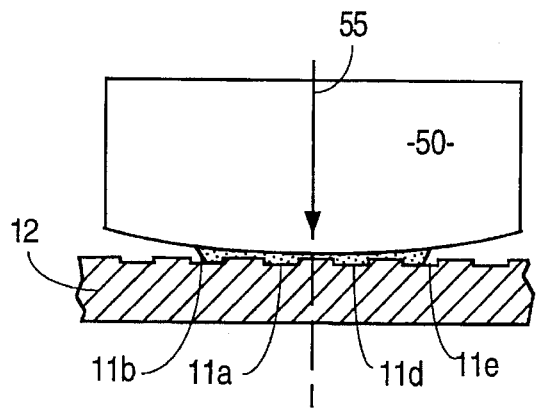
FIG. 10 illustrates a first stage of compression of the transfer pad on the substrate (mask not shown).

As seen in FIG. 7, the transfer pad in a suitable mechanical holder (not shown) is positioned over a source or reservoir of flux 60 in an insulative open-top container 63 typically made of stainless steel for ease of cleaning. The flux preferably has an even horizontal top surface 61 at a prescribed vertical height. A doctor blade 62 typical stainless steel so that it can be surface ground "flat" is movable horizontally (arrow 64) over surface 61 left-to-right to assure a proper vertical level of flux. The transfer pad is lowered (arrow 52) into the flux source a fixed vertical distance from the top surface 61 so as to pick-up by the high viscosity and high tackiness nature of the flux cream a pre-determined amount or increment 65 (FIG. 8) of flux at the central area 49 of the transfer pad bottom surface. This leaves a temporary depression 64 in the flux reservoir surface 61 which is replenished by flux piled in front of the doctor blade. More flux is added in front of the doctor blade as necessary. The transfer pad 50 is then moved (arrow 54) by an appropriate mechanism (not shown) with its picked-up increment 65 of flux, to a position (FIG. 9) over a metallization-containing substrate 12 having depressions 11a, 11b and 11c (formed by the apertures in a solder mask 13) extending leftward along an x-axis from the "land" area 58 and depressions 11d, 11e and 11f which extend rightward from land area 58. The depressions typically extend in depth to a plated or bare copper contact pad 23 on a lead frame (metallization) as seen in FIGS. 2–5. It is understood that other solder mask apertures 11 extend in the orthogonal y-axis from land area 58.

Figure 11:
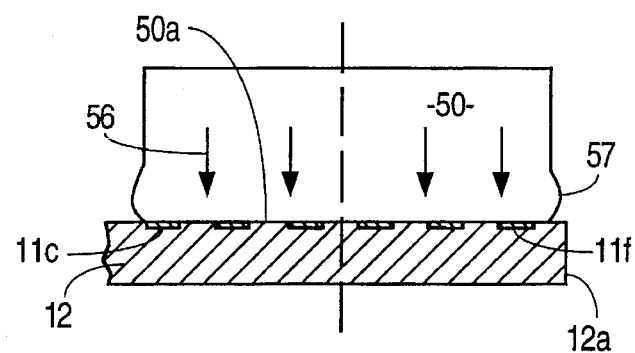
FIG. 11 illustrates the final stage of compression of the transfer pad on the substrate (mask not shown).

The transfer pad 50 is then lowered (arrow 55) onto and into a first and then a second stage of preferably continuous increasing compression of the order of 25 psi to 30 psi against the top of substrate 12 at land 58 so that the flux increment 65 is pressure forced (arrows 56) positively into each of the succeeding depressions 11a, 11d and 11b, 11e etc. (FIG. 10) both in the x-axis as shown and in the y-axis (not shown). As seen in FIG. 11 further compression of the transfer pad 50 by an about 27 psi force, as illustrated by the peripheral side bulge 57 of the pad, to a third and final stage of compression completes the filling-in of all the depressions, including outlying depressions 11c and 11f, while using up all the flux increment 65 initially picked up. This full utilization of the flux increment 65 prevents movement and pushing of any excess of flux to the peripheral edges 12a of the substrate outward of bulge 57 where that excess would interfere with transfer fixturing. The bottom of the pad then has a compressed essentially flat bottom surface 50a. Subsequently, the transfer pad is lifted off the solder mask and substrate. The spring back of the spherical surface and post, by the release of the compression force, helps to break away the transfer pad from the mask.

Figure 12:
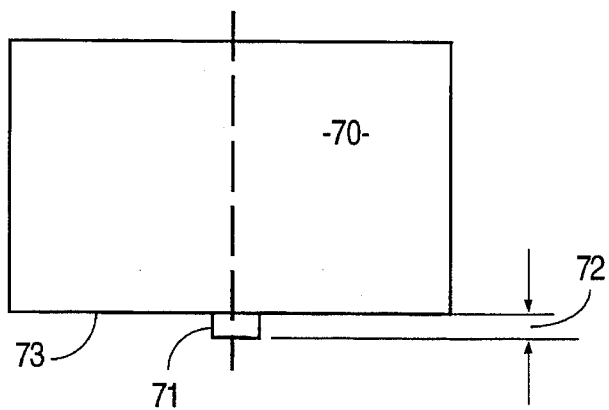
FIG. 12 is a side view of a second embodiment of the transfer pad.
Figure 13:
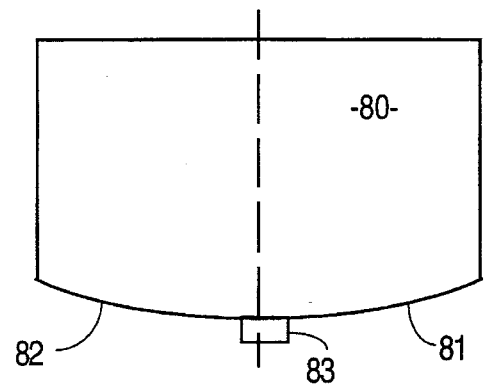
FIG. 13 is a side view of a third embodiment of the transfer pad.

FIG. 12 shows a second embodiment of a transfer pad 70 which includes on a flat bottom surface 73 thereof a central cylindrical flux pick up post 71 which can be dipped into reservoir 60 to pick-up a predetermined amount of flux dependent on the total volume of flux needed to fill the series of depressions. The flux is held by surface tension on the post exterior surfaces. In one example, post 71 has a height of 5 mm and a diameter of 10 mm while surface 73 has a diameter of 10 mm. Posts of larger diameter and longer length dipped deeper into the reservoir are used when larger volumes of flux are needed. FIG. 13 shows a third embodiment of a transfer pad 80 which has both a cylindrical center post 83 and a spherical bottom surface 82, which function as shown in both FIGS. 8–11 and FIG. 12.

A typical flux used in the described method is a cream flux obtainable as compound No. WS 609 from Alpha Metals Co. The flux normally is in the form of a semi-liquid paste. The solder balls preferably are made of 37% lead and 63% tin. The solder masks are made of epoxy or equivalent and are available from Yamamoto of Japan.

The above description of embodiments of this invention is intended to be illustrative and not limiting. Other embodiments of this invention will be obvious to those skilled in the art in view of the above disclosure.

We claim:

1. A method of applying flux into a series of spaced depressions in an essentially flat electrically insulative substrate selectively coated with an apertured solder mask, the mask apertures exposing contact metallizations on said substrate, and forming a series of spaced depressions in alignment with portions of said metallizations, said depressions being adapted after flux application to receive solder in said depressions comprising:

providing a compressible transfer pad including a bottom surface having a central flux pick-up area;

providing a source of liquid flux;

transferring a predetermined amount of flux from the source onto said transfer pad bottom surface central pick-up area;

placing the flux-containing transfer pad in juxtaposition to the solder mask and the series of depressions;

moving the central flux pick-up area of the transfer pad and the solder mask into contact with each other to force flux from said transfer pad into a first depression;

moving one of the transfer pad and the solder mask against one another with sufficient pressure to compress said transfer pad bottom surface and to force remaining flux on said central flux pickup area of the transfer pad into successive depressions of said series of spaced depressions spaced from the first depression; and after said series of spaced depressions have been substantially filled with flux, separating the transfer pad from the mask to permit deposition of solder into said flux-containing depressions.

2. The method of claim 1 wherein said spaced depressions of said mask are aligned with plated pads on the metallizations.

3. The method of claim 1 in which said central pick-up area is a central area of a semi-spherical bottom surface of said transfer pad and wherein said semi-spherical bottom surface is compressed by a continuously increasing force such as to approach or result in an essentially flat bottom surface of the transfer pad compressed on said solder mask.

4. The method of claim 1 in which said central flux pick-up area comprises a post extending from the transfer pad bottom surface and wherein said post and said bottom surface are compressed such as to approach or result in an essentially flat bottom surface of the transfer pad compressed on said solder mask.

5. The method of claim 4 in which said post is a cylindrical post having a diameter of from about 5 mm to 10 mm.

6. The method of claim 4 in which said transfer pad bottom surface is semi-spherical to facilitate break-away of the transfer pad from the mask.

7. The method of claim 1 including the step of doctor blading the flux source to assure a horizontal level of flux in the flux source.

8. The method of claim 1 in which the transferring step comprises dipping the central flux pick-up area of the transfer pad into a predetermined depth of said flux source dependent on the total number and size of the series of spaced depressions on said substrate.

9. The method of claim 1 wherein said transfer pad is constructed of a rubber-like material having a durometer of from about 20 to about 90 Shore.

10. The method of claim 9 wherein said transfer pad is constructed of silicone rubber.

11. The method of claim 1 wherein the moving to compress step includes squeezing flux off top areas of the mask between said series of depressions while preventing the flux from touching peripheral edges of said substrate.

12. The method of claim 1 in which said series of depressions are from about 25 mils to about 35 mils in diameter.

13. The method of claim 1 wherein said substrate is a printed circuit board and further including providing a plated via extending through the printed circuit board, said metallizations extending from the series of depressions to said plated vias.

* * * * *